United States Patent
Mun

(10) Patent No.: US 7,952,426 B2
(45) Date of Patent: May 31, 2011

(54) DIGITAL AUDIO AMPLIFIER AND DIGITAL AUDIO AMPLIFYING METHOD THEREFOR

(75) Inventor: Byoung-Min Mun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 235 days.

(21) Appl. No.: 12/090,278

(22) PCT Filed: Oct. 24, 2006

(86) PCT No.: PCT/KR2006/004341
§ 371 (c)(1),
(2), (4) Date: Apr. 15, 2008

(87) PCT Pub. No.: WO2007/049898
PCT Pub. Date: May 3, 2007

(65) Prior Publication Data
US 2008/0252370 A1    Oct. 16, 2008

(30) Foreign Application Priority Data

Oct. 24, 2005 (KR) .................. 10-2005-0100402

(51) Int. Cl.
*H03F 3/38* (2006.01)
(52) U.S. Cl. ........................................... 330/10; 330/59
(58) Field of Classification Search .................... 330/10, 330/207 A, 251, 59
See application file for complete search history.

(56) References Cited

U.S. PATENT DOCUMENTS

| 5,270,904 | A | * | 12/1993 | Gulczynski | ...................... 363/97 |
| 5,949,282 | A | | 9/1999 | Nguyen et al. | |
| 5,986,498 | A | * | 11/1999 | Rodriguez | ....................... 330/10 |
| 6,396,340 | B1 | * | 5/2002 | Schmitt et al. | ................... 330/10 |
| 6,563,377 | B2 | * | 5/2003 | Butler | .............................. 330/10 |
| 7,221,216 | B2 | * | 5/2007 | Nguyen | .......................... 330/10 |
| 7,279,967 | B2 | * | 10/2007 | Quilter | ........................... 330/10 |

(Continued)

FOREIGN PATENT DOCUMENTS

JP         06-244654         9/1994

(Continued)

OTHER PUBLICATIONS

Japanese Office Action issued Jun. 22, 2010 in JP Application No. 2008-535471.

*Primary Examiner* — Steven J Mottola
(74) *Attorney, Agent, or Firm* — Stanzione & Kim, LLP

(57) ABSTRACT

A digital audio signal amplifier and a digital audio signal amplifying method provide safety and power efficiency by integrating a switching mode power supply and a digital audio amplifier into an apparatus. The digital audio amplifier includes a pulse modulation unit generate a pulse modulated audio signal by pulse-modulating an input audio signal, a switching unit to switch a DC voltage based on the pulse modulated audio signal, an insulation transformer to transform the output of the switching unit and to output the result of the transforming, and a low-pass filter to obtain an audio signal corresponding to the input audio signal by low-pass filtering the output of the insulation transformer, and to output the output audio signal. By integrating a switching mode power supply and a digital audio amplifier into an apparatus, the digital audio amplifier satisfies the insulation requirement and at the same time increases power efficiency.

23 Claims, 7 Drawing Sheets

U.S. PATENT DOCUMENTS

2004/0036529 A1   2/2004   Tsuji et al.

FOREIGN PATENT DOCUMENTS

| | | |
|---|---|---|
| JP | 2002-151979 | 5/2002 |
| JP | 2003-188660 | 7/2003 |
| JP | 2004-007324 | 1/2004 |
| JP | 2005-72766 | 3/2005 |
| JP | 2005-236349 | 9/2005 |
| JP | 2005-269580 | 9/2005 |
| KR | 2004-50410 | 6/2004 |
| KR | 2005-20353 | 3/2005 |
| KR | 2006-16222 | 2/2006 |

* cited by examiner

DIGITAL AUDIO AMPLIFIER AND DIGITAL AUDIO AMPLIFYING METHOD THEREFOR

CROSS-REFERENCE TO RELATED APPLICATIONS

This application claims the benefit and priority under 35 U.S.C. §§119 and 365 from Korean Patent Application No. 10-2005-0100402, filed on Oct. 24, 2005, in the Korean Intellectual Property Office, and International Application No. PCT/KR2006/004341, filed on Oct. 24, 2006, the disclosures of which are incorporated herein in their entirety by reference.

BACKGROUND OF THE INVENTION

1. Field of the Invention

The present general inventive concept relates to a digital audio amplifier, and more particularly, to a digital audio signal amplifier in which both safety and power efficiency are achieved by integrating a switching mode power supply and a digital audio amplifier into one body, and a digital audio signal amplifying method thereof.

2. Description of the Related Art

In general, a digital audio system includes a direct current (DC) voltage supply unit generating a DC voltage from a commercial alternating current (AC) voltage; and a digital audio amplifier pulse-modulating the DC voltage using an audio signal, low-pass filtering the pulse-modulated DC voltage, and obtaining an output audio signal corresponding to the input audio signal.

Here, for the safety of users, the DC voltage supply unit is required to have a function of insulating the commercial AC voltage from the digital audio amplifier. Accordingly, a switching mode power supply (SMPS) having an insulation transformer is generally used as the DC voltage supply unit. Meanwhile, the digital audio amplifier is generally a D class digital audio amplifier to increase the output power.

FIG. 1 is a block diagram illustrating a conventional digital audio system 100. The audio system 100 of FIG. 1 includes an SMPS 110 and a D class audio amplifier 130.

The SMPS 110 converts an input commercial AC voltage into a DC voltage using a first rectifying and smoothing unit 112, switches the DC voltage in a switching unit 116 operating at a rate corresponding to a pulse width modulation (PWM) signal having a frequency of tens to hundreds of kHz or higher generated in a PWM modulation unit 114, transforms the switched DC voltage with an insulation transformer 118 having an appropriate winding ratio, rectifies the output of the insulation transformer 118 through a second rectifying and smoothing unit 120, and outputs a DC voltage. Also, though it is not shown, an error signal is fed back to the PWM modulation unit 114 to adjust a frequency of a pulse modulated signal and a duty ratio, so that a constant DC voltage can be output irrespective of changes in the input voltage or output current.

The insulation transformer 118 insulates a primary coil side, i.e., the commercial AC voltage source, from a secondary coil side, i.e., the digital audio amplifier 130. Also, an error signal detected in the secondary side is fed back to the PWM modulation unit 114 of the primary side through a photo coupler (not shown) to provide electrical isolation.

Meanwhile, the D class digital audio amplifier 130 switches the DC voltage provided by the SMPS 110 at a D class output end 134 by a PWM audio signal generated from the PWM modulation unit 132, low-pass filters the switched DC voltage through a low-pass filter 136, and generates an output audio signal corresponding to an original audio signal. Meanwhile, though it is not shown, in order to stabilize the audio output a negative feedback signal is generated from the output of the insulation transformer 118 to control the pulse modulation of the PWM modulation unit 114.

FIG. 2 illustrates waveform diagrams illustrating an operation of the D class digital audio amplifier 130 of FIG. 1. Referring to FIG. 2, a PWM audio signal is obtained by modulating a 180 kHz or higher triangular wave carrier with an input audio signal of 20 kHz or lower. The switched DC voltage is obtained by switching the DC voltage with the PWM audio signal. Also, the output audio signal is obtained by low-pass filtering the switched DC voltage. As illustrated in FIG. 2, the input audio signal is similar to the output audio signal.

However, the conventional digital audio system as illustrated in FIG. 1 has a problem in that the power efficiency is low and the manufacturing cost is high.

For example, assuming that the power efficiency of the SMPS 110 is P1 and the power efficiency of the digital audio amplifier 130 is P2, the power efficiency Pt of a conventional digital audio system 100 is P1×P2. Here, since each of P1 and P2 has a value less than 1, and Pt becomes less than P1 and P2, respectively, the conventional digital audio system 100 has very low power efficiency.

Meanwhile, in the SMPS 110 and the digital audio amplifier 130 of FIG. 1, the PWM modulation units 114 and 132 perform the same PWM modulation, the rectifying and smoothing units 112 and 120 perform the same rectifications, and the switching unit 116 and the D class output end 134 perform the same switching operation. That is, it can be seen that the units performing the same operation are disposed redundantly, accordingly manufacturing costs are increased.

SUMMARY OF THE INVENTION

The present general inventive concept provides a digital audio amplifier capable of increasing power efficiency and reducing manufacturing costs by eliminating redundant parts in an SMPS and a digital audio amplifier.

The present general inventive concept also provides a digital audio signal amplifying method capable of increasing power efficiency and reducing manufacturing costs.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a digital audio amplifier including a pulse modulation unit to generate a pulse modulated audio signal by pulse-modulating an input audio signal, a switching unit to switch a direct current (DC) voltage based on the pulse modulated audio signal, an insulation transformer to transform the output of the switching unit and to output the result of the transforming, and a low-pass filter to obtain an audio signal corresponding to the input audio signal by low-pass filtering the output of the insulation transformer, and to output the audio signal.

The switching unit and the low-pass filter may be disposed on the primary side and on the secondary side, respectively, of the insulation transformer, and the digital audio amplifier may further include a photo coupler photo-coupling the pulse modulated audio signal and providing the result to the switching unit. The pulse modulation unit may pulse-width modulate the input audio signal.

The foregoing and/or other aspects and utilities of the present general inventive concept may also be achieved by providing a digital audio amplifying method including generating a pulse modulated audio signal by pulse-modulating an input audio signal, switching a DC voltage based on the pulse modulated audio signal and generating a switched DC voltage, transforming the switched DC voltage through an insulation transformer, and low-pass filtering the output of the insulation transformer and outputting an output audio signal corresponding to the input audio signal.

The foregoing and/or other aspects and utilities of the present general inventive concept may also be achieved by providing a digital audio amplifier including a pulse modulation unit to modulate an input audio signal to generate a pulse modulated audio signal, a switching unit to switch a voltage according to the pulse modulated audio signal, an insulation transformer to receive the switched voltage and to transform the switched voltage, and a low-pass filter to filter the transformed voltage to output an audio signal corresponding to the input audio signal.

The insulation transformer may be connected between the switching unit and the low-pass filter.

The voltage may be a DC voltage, and the switched voltage may be an AC voltage.

The amplifier may further include a photo-coupler connected between the switching unit and the pulse modulation unit.

The amplifier may further include a photo-coupler connected to the pulse modulation unit to receive the audio signal therethrough.

The amplifier may further include a feed-back unit to transmit a feedback signal from the insulation transformer to the pulse modulation unit.

The amplifier may further include a DC voltage source connected to the switching unit to generate a DC voltage as the voltage, and the DC voltage source may not have at least one of another pulse modulation unit to generate a PWM signal, another switching unit to switch another voltage to generate an AC voltage, and another insulation transformer to transform the AC voltage to generate the DC voltage as the voltage.

The insulation transformer may include a primary coil side connected to the switching unit and a secondary coil side connected to the low-pass filter such that the transformed voltage is insulated from the switched voltage.

The amplifier may further include a DC voltage source connected to the switching unit to generate a DC voltage as the voltage, and the DC voltage source may receive an AC voltage and include a bridge diode circuit to rectify and smooth the AC voltage to generate the voltage.

The foregoing and/or other aspects and utilities of the present general inventive concept may also be achieved by providing a digital audio amplifier including a pulse modulation unit to modulate an input audio signal to generate a pulse modulated audio signal, a switching unit to switch a voltage according to the pulse modulated audio signal, a low-pass filter to filter the switched voltage to output an audio signal corresponding to the input audio signal, and an insulating transformer connected between the switching unit and the low pass filter to provide an insulation between the switched voltage and the audio signal.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

Figure 1:
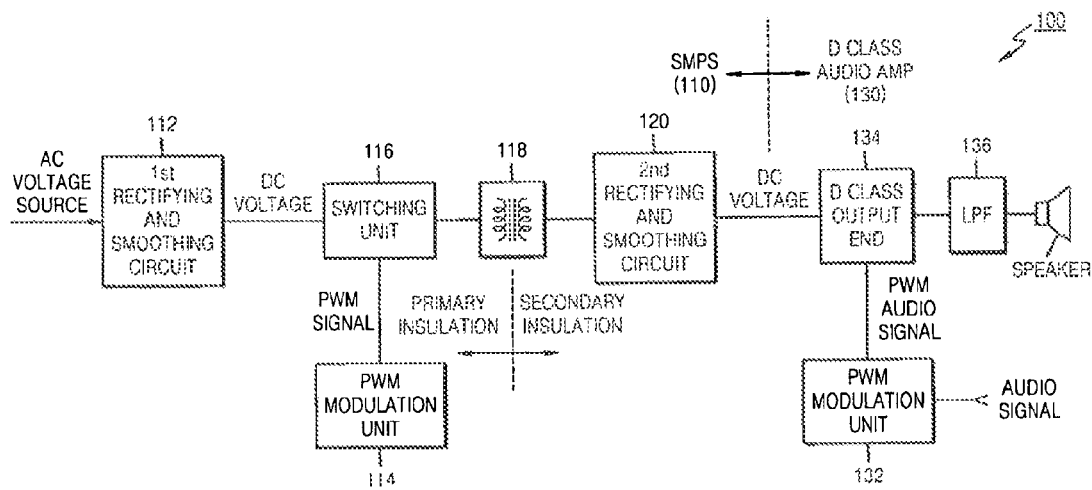
FIG. 1 is a block diagram illustrating a conventional digital audio system.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
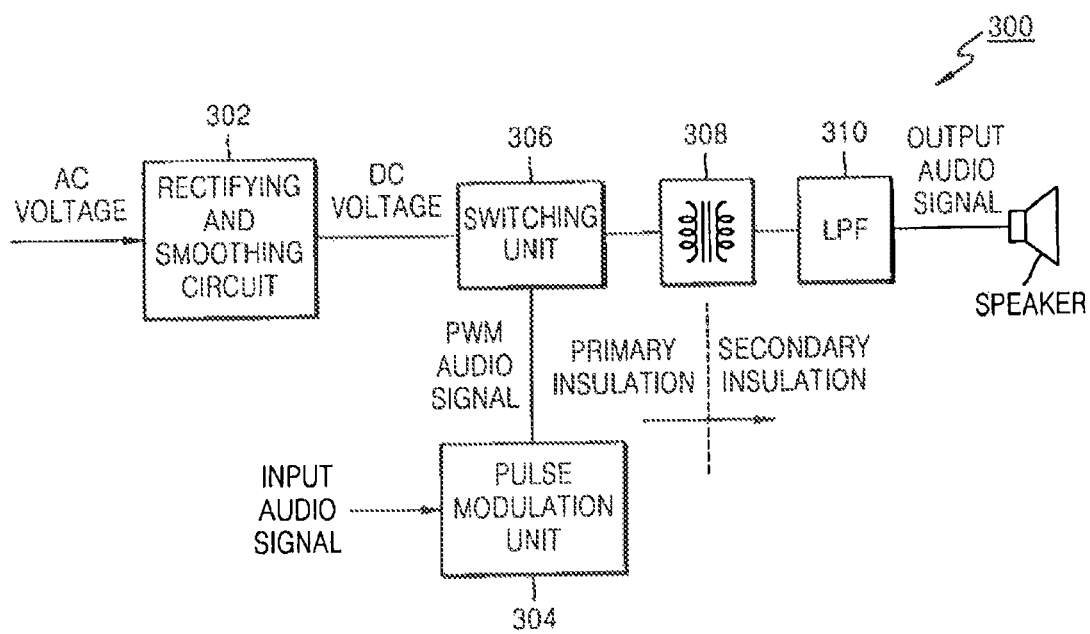
FIG. 3 is a block diagram illustrating a digital audio amplifier according to an embodiment of the present general inventive concept.

FIG. 3 is a block diagram illustrating a digital audio amplifier according to an embodiment of the present general inventive concept. The digital audio amplifier 300 of FIG. 3 includes a rectifying and smoothing unit 302, a pulse modulation unit 304, a switching unit 306, an insulation transformer 308, and a low-pass filter 310. As used herein, the term "insulation transformer" has the same meaning as the term "isolation transformer."

The rectifying and smoothing unit 302 converts a commercial AC voltage into a DC voltage. The pulse modulation unit 304 pulse-modulates an input audio signal and provides the obtained pulse modulated audio signal to the switching unit 306. The switching unit 306 switches the DC voltage provided by the rectifying and smoothing unit 302 using the pulse modulated audio signal and generates a switched DC voltage. The insulation transformer 308 includes a primary coil side connected to the switching unit 306 and a secondary coil side connected to the LPF 310 to transform and output the switched DC voltage output from the switching unit 306. The low-pass filter 310 low-pass filters the output of the insulation transformer 308 and outputs an output audio signal corresponding to the input audio signal. The output audio signal is provided to a speaker to reproduce sound corresponding to the output audio signal.

Here, the commercial AC voltage is insulated from the low-pass filter 310 by the insulation transformer 308.

Referring to FIG. 3, compared to the conventional digital audio system 100 of FIG. 1, the digital audio system of FIG. 3 does not have the problem of redundancy of the rectifying and smoothing units, the pulse modulation units, and the switching units. Accordingly, power efficiency and manufacturing costs are improved.

Figure 4:
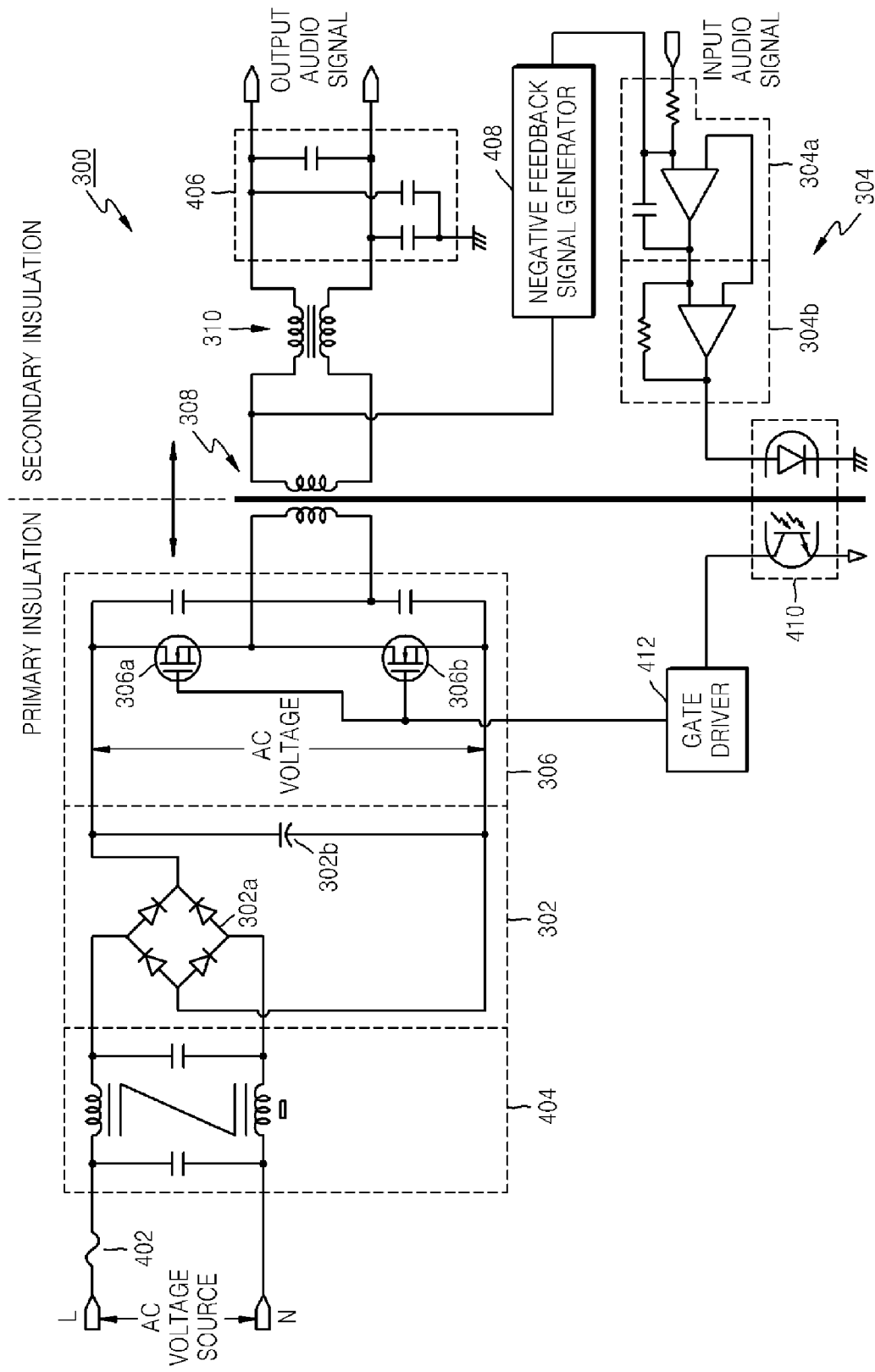
FIG. 4 is a circuit diagram illustrating a digital audio amplifier according to an embodiment of the present general inventive concept.

FIG. 4 is a circuit diagram illustrating the digital audio amplifier 300 according to an embodiment of the present general inventive concept. According to the embodiment shown in FIG. 4, the pulse modulator 304 is disposed on the secondary coil side of the insulation transformer 308, and the PWM audio signal that is the output of the pulse modulator 304 is provided to the switching unit 306 disposed on the primary coil side of the insulation transformer 308, through a photo coupler 410.

Referring to FIG. 4, the digital audio amplifier 300 includes a fuse 402, a filter 404 to prevent electromagnetic interference (EMI), a capacitor unit 406 having capacitors to filter noise between signal lines or between signal lines and the chassis, a negative feedback signal generator 408, the photo coupler 410 having a photo-diode and a photo-transistor to photo-couple the pulse modulated audio signal between the pulse modulation unit 304 and the switching unit 306, and a gate driver 412 to amplify the output of the photo coupler 410 to a level which is enough to drive switching transistors 306a and 306b of the switching unit 306.

The rectifying and smoothing unit 302 includes a bridge rectifier 302a and a smoothing capacitor 302b. The switching unit 306 includes switching transistors 306a and 306b to perform an operation complementary to each other. The switching unit 306 of FIG. 4 performs a switching operation corresponding to a half-bridge type D class digital audio amplifier. However, it should be noted that the present general inventive concept is not limited thereto. The present general inventive concept can be constructed to perform a switching operation corresponding to a full-bridge type D class digital audio amplifier.

Figure 5:
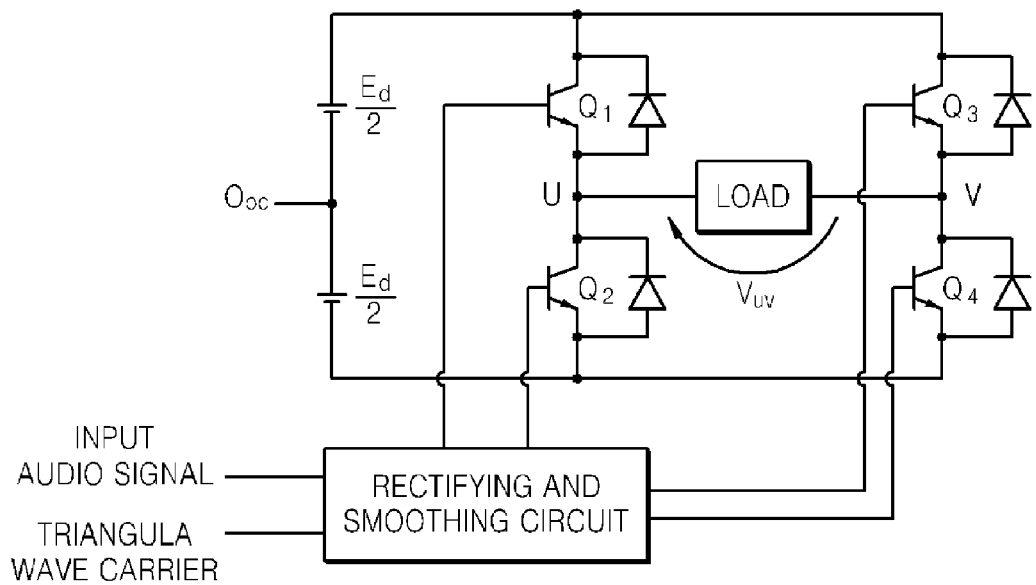
FIG. 5 illustrates an example illustrating a full-bridge type digital audio amplifier according to an embodiment of the present general inventive concept.

FIG. 5 illustrates an example of a full-bridge type digital audio amplifier according to an embodiment of the present general inventive concept. The full-bridge type digital audio amplifier may include a rectifying and smoothing circuit to receive an input audio signal and a triangular wave carrier to generate a switching signal to be transmitted to a switching unit having a first pair U of transistors Q1 and Q2 and a second pair V of transistors Q3 and Q4. An output power (or voltage) Vuv of the switching unit is applied to a load such that an audio signal is reproduced. One or more power sources Ed/2 are connected to the transistors Q1, Q2, Q3, and Q4 to supply a power to the switching unit, and a signal Ooc is connected to the power sources Ed/2 to control the power sources Ed/2. The switching unit of FIG. 5 may be used as the switching unit 306 of FIG. 4

Referring back to FIG. 4, the insulation transformer 308 includes a ferrite core in order to reduce EMI and enhance efficiency.

The pulse modulator 304 includes an integration circuit 304a and a Schmitt trigger 304b. The integration circuit 304a integrates an audio signal and a negative feedback signal of the negative feedback generator 408 according to an output of the insulation transformer 308 and a reference, and the output of the Schmitt trigger 304b is oscillated by the output of the integration circuit 304a. A PWM audio signal is obtained through the integration circuit 304a and the Schmitt trigger 304b.

Figure 6:
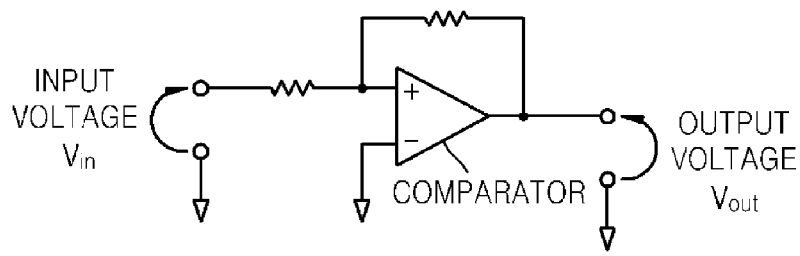
FIG. 6 illustrates an operation of a Schmitt trigger of the digital audio amplifier of FIG. 5.
Figure 6:
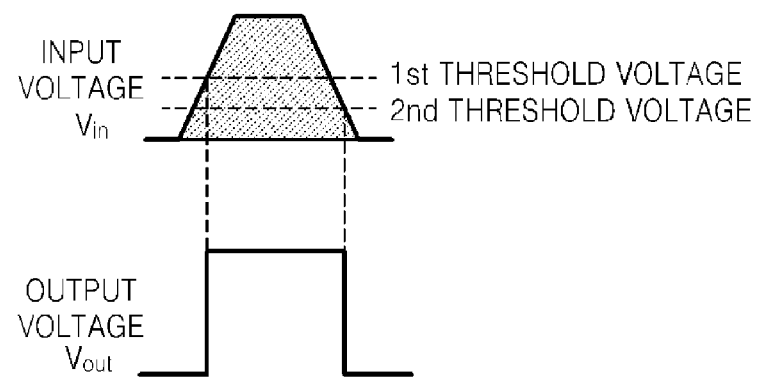

FIG. 6 illustrates an operation of the Schmitt trigger 304b of FIG. 5. The Schmitt trigger 304b has two threshold voltages. For example, if an input voltage (Vin) becomes greater than a first threshold, the output voltage (Vout) is transited to a logic level 1. Once the output voltage (Vout) becomes the logic level 1, the logic level 1 is maintained while the input voltage is between the first threshold voltage and a second threshold voltage. If the input voltage (Vin) becomes less than the second threshold voltage, the output voltage (Vout) returns to a logic level 0.

Accordingly, the Schmitt trigger 304a may output a pulse width modulated signal corresponding to a change in the output of the integration circuit 304a as the PWM audio signal.

Referring back to FIG. 4, the PWM audio signal output from the pulse modulation unit 304 is provided to the gate driver 412 through the photo coupler 410. The gate driver 412 amplifies the output of the photo coupler 410 to a level which is enough to drive the switching transistors 306a and 306b of the switching unit 306.

The DC voltage is switched, i.e., pulse width modulated, by a switching operation of the switching unit 306. The output of the switching unit 306 is transformed through the insulation transformer 308, and low-pass filtered through the low-pass filter 310 and output as an output audio signal.

The negative feedback signal generator 408 is used to provide a stable output audio signal regardless of a change in the input voltage and the output current. The negative feedback signal generator 408 generates a negative feedback signal corresponding to the magnitude of the output audio signal, from the output of the insulation transformer 308. The negative feedback signal generator 408 can be implemented simply, for example, by a resistor.

The negative feedback signal is provided to the integration circuit 304a. The integration circuit 304a integrates the audio signal and the negative feedback signal, that is, amplifies the synthesized signal of the audio signal and the negative feedback signal.

When the level of the output audio signal is changed to be higher than a normal level due to a change in the input voltage and output current when the output audio is in a stable state, that is, a state in which the negative feedback signal has a constant value, the negative feedback signal decreases, and as a result, the duty ratio of the PWM audio signal decreases. Accordingly, the duty ratio of the switched DC voltage decreases and therefore the level of the output signal falls.

When the level of the output audio signal is changed to be lower than a normal level due to a change in the input voltage and output current, the negative feedback signal increases, and as a result, the duty ratio of the PWM audio signal increases. Accordingly, the duty ratio of the switched DC voltage increases and therefore the level of the output signal rises.

Figure 7:
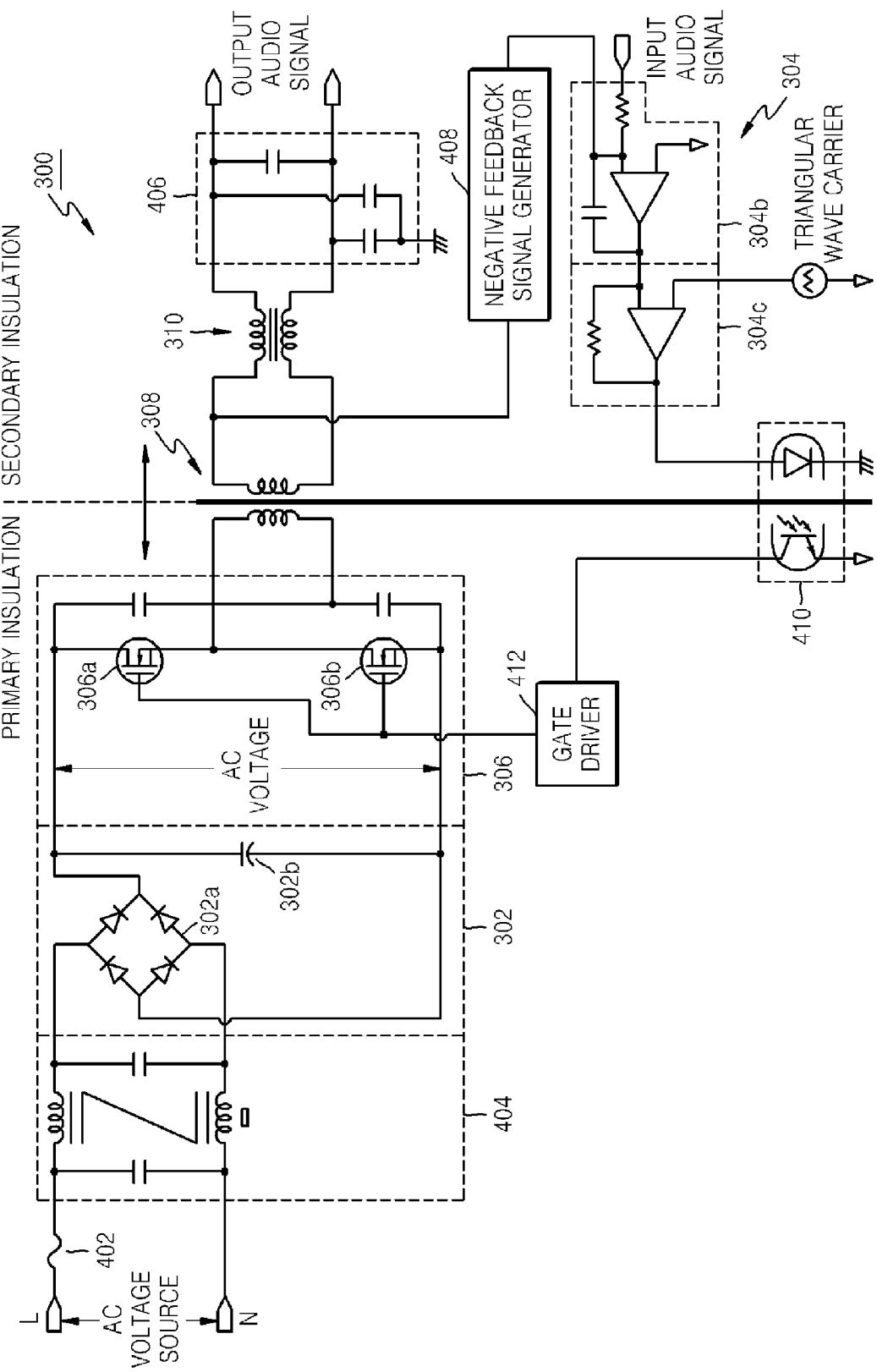
FIG. 7 is a circuit diagram illustrating a digital audio amplifier according to an embodiment of the present general inventive concept.

FIG. 7 is a circuit diagram illustrating a digital audio amplifier according to an embodiment of the present general inventive concept. In the present embodiment of FIG. 7, a pulse modulator 304 is disposed on the secondary coil side of an insulation transformer 308, and the PWM audio signal output from the pulse modulator 304 is provided to a switching unit 306 disposed on the primary coil side of the insulation transformer 308 through a photo coupler 410 similar to the embodiment of FIG. 4. However, the embodiment of FIG. 7 is different from that of FIG. 4 in that a comparator 304c is employed instead of the Schmitt trigger 304b.

Figure 2:
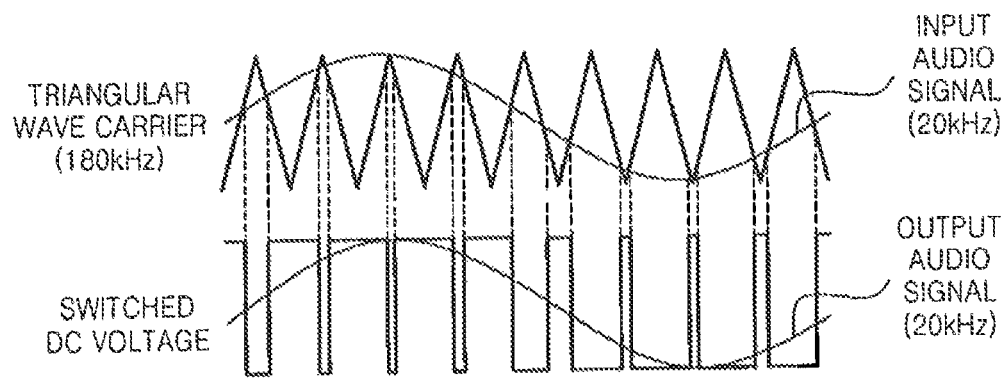
FIG. 2 illustrates waveform diagrams illustrating an operation of a D class digital audio amplifier of the conventional digital audio system of FIG. 1.

The comparator 304c compares the output of an integration circuit 304a and a triangular wave carrier and outputs a PWM audio signal. The operations of the comparator 304c and the digital audio amplifier 300 can be clearly understood with reference to the waveforms shown in FIG. 2.

Figure 8:
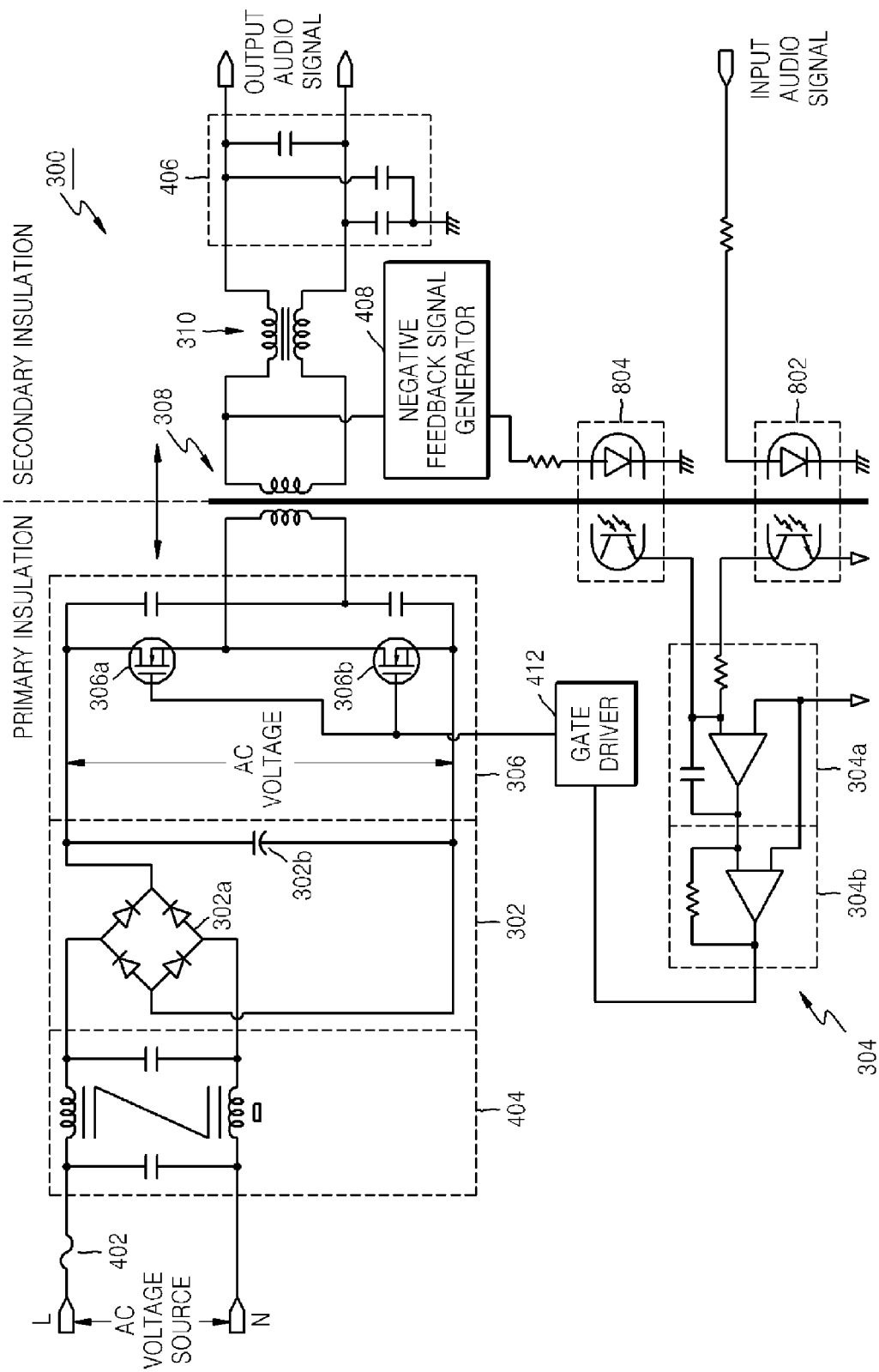
FIG. 8 is a circuit diagram illustrating a digital audio amplifier according to another embodiment of the present general inventive concept.

FIG. 8 is a circuit diagram illustrating a digital audio amplifier 300 according to another embodiment of the present general inventive concept. Compared to the embodiment of FIG. 4, the embodiment of FIG. 8 include a pulse modulator 304 disposed on the primary coil side of an insulation transformer 308 such that an input audio signal and a negative feedback signal are provided to the pulse modulator 304 through photo couplers 802 and 804, respectively. By doing so, insulation of the audio signal and the negative feedback signal is achieved.

Figure 9:
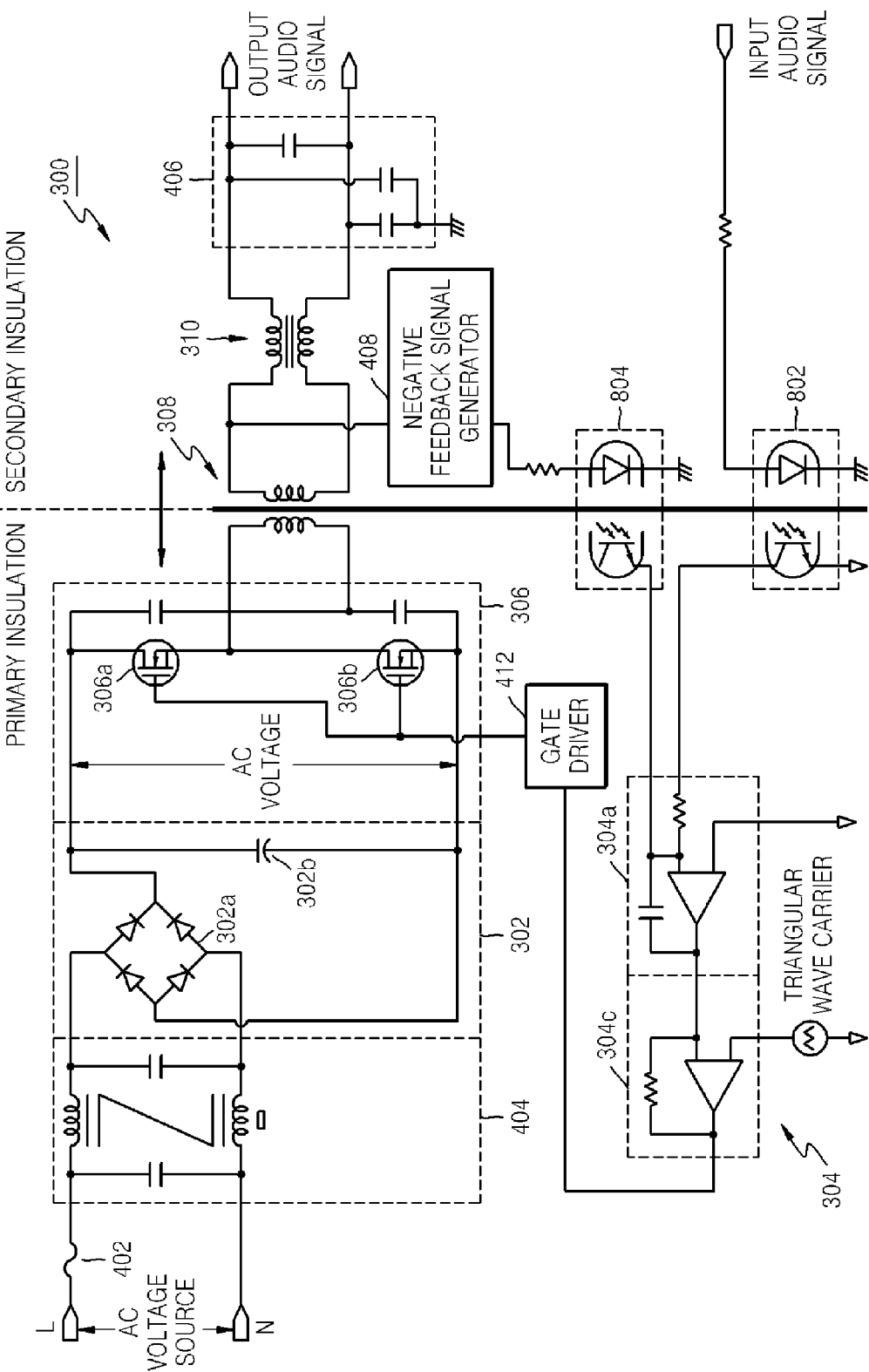
FIG. 9 is a circuit diagram illustrating a digital audio amplifier according to still another embodiment of the present general inventive concept.

FIG. 9 is a circuit diagram illustrating a digital audio amplifier 300 according to still another embodiment of the present general inventive concept. In the embodiment of FIG. 9, a pulse modulator 304 is disposed on the primary coil side of an insulation transformer 308, and an input audio signal and a negative feedback signal are provided to the pulse modulator 304 through photo couplers 802 and 804, respectively, similar to the embodiment of FIG. 8.

However, the embodiment of FIG. 9 is different from that of FIG. 8 in that a comparator 304c is employed instead of the Schmitt trigger 304b.

If the digital audio amplifier according to the present general inventive concept is employed, the PWM modulation units and switching units which are usually used in both the SMPS and the D class digital audio amplifier can be simplified such that the number of parts and components, manufacturing cost, and installation space can be reduced.

In addition, since the circuit becomes simplified, reliability is increased.

Also, if the digital audio amplifier according to the present general inventive concept is used, the SMPS can be omitted, which improves power efficiency reduces the space required for heat radiation.

According to experiments performed by the applicant, when the SMPS and the D class digital audio amplifier were used, the power consumption was 130 watts. However, according to the present invention, the power consumption was 111 watts, that is, power consumption was reduced by 19 watts. As a result, by lowering the current rates of a variety of filters preventing EMI, a bridge rectifier to rectify an AC voltage, and a smoothing condenser, a digital audio amplifier can be manufactured at a lower cost.

According to the digital audio amplifier of the present general inventive concept, by integrating a switching mode power supply and a digital audio amplifier into a single unit, the digital audio amplifier satisfies the insulation requirement and at the same time increases power efficiency.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

The invention claimed is:

1. A digital audio amplifier comprising:
a pulse modulation unit to generate a pulse modulated audio signal by pulse-modulating an input audio signal;
a switching unit to switch a direct current (DC) voltage based on the pulse modulated audio signal;
an insulation transformer to transform the output of the switching unit and to output the result of the transforming; and
a low-pass filter to obtain an audio signal corresponding to the input audio signal by low-pass filtering the output of the insulation transformer, and output the audio signal,
wherein the pulse modulation unit comprises:
an integration circuit to integrate the input audio signal, and
a Schmitt trigger having an output to be oscillated with respect to the output of the integration circuit; and
the pulse modulation unit pulse-width modulates the input audio signal through the integration circuit and the Schmitt trigger.

2. The amplifier of claim 1, wherein:
the switching unit and the low-pass filter are disposed on a primary coil side and a secondary coil side, respectively, of the insulation transformer; and
the digital audio amplifier further comprises a photo coupler to photo-couple the pulse modulated audio signal and to provide the result to the switching unit.

3. The amplifier of claim 1, further comprising:
a negative feedback signal generator to generate a negative feedback signal from the output of the insulation transformer,
wherein the integration circuit integrates the input audio signal and the negative feedback signal.

4. A digital audio amplifier comprising:
a pulse modulation unit to generate a pulse modulated audio signal by pulse-modulating an input audio signal;
a switching unit to switch a direct current (DC) voltage based on the pulse modulated audio signal;
an insulation transformer to transform the output of the switching unit and to output the result of the transforming; and
a low-pass filter to obtain an audio signal corresponding to the input audio signal by low-pass filtering the output of the insulation transformer, and output the audio signal,
wherein the switching unit and the low-pass filter are disposed on a primary coil side of the insulation transformer, and the digital audio amplifier further comprises a first photo coupler to photo-couple the input audio signal and to provide the result to the pulse modulation unit.

5. The amplifier of claim 4, wherein the pulse modulation unit pulse-width modulates the output of the first photo coupler.

6. The amplifier of claim 5, wherein:
the pulse modulation unit comprises:
an integration circuit integrating the output of the first photo coupler, and
a Schmitt trigger to output an output signal to be oscillated with respect to the output of the integration circuit; and
a pulse-width modulated audio signal corresponding to the input audio signal is obtained through the integration circuit and the Schmitt trigger.

7. The amplifier of claim 6, further comprising:
a negative feedback signal generator to generate a negative feedback signal from the output of the insulation transformer; and
a second photo coupler photo-couple the negative feedback signal and to provide the result to the integration circuit,
wherein the integration circuit integrates the outputs of the first and second photo couplers.

8. The amplifier of claim 5, wherein:
the pulse modulation unit comprises:
an integration circuit to integrate an output of the first photo coupler; and
a comparator to compare the output of the integration circuit and a triangular wave carrier; and
a pulse-width modulated audio signal corresponding to the input audio signal is obtained through the integration circuit and the comparator.

9. The amplifier of claim 8, further comprising:
a negative feedback signal generator to generate a negative feedback signal from the output of the insulation transformer; and a second photo coupler to photo-couple the negative feedback signal, wherein the integration circuit integrates the outputs of the first and second photo couplers.

10. The amplifier of claim 1, wherein the insulation transformer comprises a ferrite core.

11. The amplifier of claim 1, further comprising:
a rectifying and smoothing unit to rectify and smooth an alternating current (AC) voltage and to provide a direct current (DC) voltage.

12. The amplifier of claim 1, further comprising:
a gate driver to amplify a level of the modulated audio signal to a level to drive the switching unit.

13. A digital audio amplifying method comprising:
generating a pulse modulated audio signal by pulse-modulating an input audio signal;
switching a DC voltage based on the pulse modulated audio signal and generating a switched DC voltage;
transforming the switched DC voltage through an insulation transformer; and
low-pass filtering the output of the insulation transformer and outputting an output audio signal corresponding to the input audio signal,
wherein the generating a pulse modulated output signal comprises:
integrating the input audio signal, and
oscillating an output of a Schmitt trigger with respect to a result of the integrating; and
pulse-width modulating a result of the oscillating.

14. A digital audio amplifier comprising:
a pulse modulation unit to modulate an input audio signal to generate a pulse modulated audio signal;
a switching unit to switch a voltage according to the pulse modulated audio signal;
an insulation transformer to receive the switched voltage and to transform the switched voltage; and
a low-pass filter to filter the transformed voltage to output an audio signal corresponding to the input audio signal,
wherein the pulse modulation unit comprises:
an integration circuit to integrate the input audio signal, and
a Schmitt trigger having an output to be oscillated with respect to the output of the integration circuit; and
the pulse modulation unit pulse-width modulates the input audio signal through the integration circuit and the Schmitt trigger.

15. The amplifier of claim 14, wherein the insulation transformer is connected between the switching unit and the low-pass filter.

16. The amplifier of claim 14, wherein the voltage is a DC voltage, and the switched voltage is an AC voltage.

17. The amplifier of claim 14, further comprising:
a photo-coupler connected between the switching unit and the pulse modulation unit.

18. The amplifier of claim 14, further comprising:
a photo-coupler connected to the pulse modulation unit to receive the audio signal therethrough.

19. The amplifier of claim 14, further comprising:
a feed-back unit to transmit a feedback signal from the insulation transformer to the pulse modulation unit.

20. The amplifier of claim 14, further comprising:
a DC voltage source connected to the switching unit to generate a DC voltage as the voltage,
wherein the DC voltage source does not have at least one of another pulse modulation unit to generate a PWM signal, another switching unit to switch another voltage to generate an AC voltage, and another insulation transformer to transform the AC voltage to generate the DC voltage as the voltage.

21. The amplifier of claim 20, wherein the insulation transformer comprises a primary coil side connected to the switching unit and a secondary coil side connected to the low-pass filter such that the transformed voltage is insulated from the switched voltage.

22. The amplifier of claim 14, further comprising:
a DC voltage source connected to the switching unit to generate a DC voltage as the voltage,
wherein the DC voltage source receives an AC voltage and comprises a bridge diode circuit to rectify and smooth the AC voltage to generate the voltage.

23. A digital audio amplifier comprising:
a pulse modulation unit to modulate an input audio signal to generate a pulse modulated audio signal;
a switching unit to switch a voltage according to the pulse modulated audio signal;
a low-pass filter to filter the switched voltage to output an audio signal corresponding to the input audio signal; and
an insulating transformer connected between the switching unit and the low pass filter to provide insulation between the switched voltage and the audio signal,
wherein the pulse modulation unit comprises:
an integration circuit to integrate the input audio signal, and
a Schmitt trigger having an output to be oscillated with respect to the output of the integration circuit; and
the pulse modulation unit pulse-width modulates the input audio signal through the integration circuit and the Schmitt trigger.

* * * * *